United States Patent
Ye et al.

(10) Patent No.: US 11,561,252 B2
(45) Date of Patent: Jan. 24, 2023

(54) COAXIAL LEAD STRUCTURE AND METHOD FOR RADIATING GIS PARTIAL DISCHARGE UHF SIGNAL OUTWARD

(71) Applicants: State Grid Fujian Electric Power Co., Ltd., Fujian (CN); State Grid Fujian Electric Power Research Institute, Fujian (CN); North China Electric Power University, Beijing (CN)

(72) Inventors: Zhaoping Ye, Fujian (CN); Shusheng Zheng, Beijing (CN); Ye Chen, Fujian (CN); Dengfeng Wei, Fujian (CN); Zhiwen Bian, Fujian (CN); Yanxue Guo, Fujian (CN); Ying Ruan, Fujian (CN); Yonghao Wu, Fujian (CN); Jinxiang Chen, Fujian (CN); Zhiwei Fu, Fujian (CN); Mingfeng Deng, Fujian (CN); Yu Zheng, Fujian (CN)

(73) Assignees: State Grid Fujian Electric Power Co., Ltd., Fuzhou (CN); State Grid Fujian Electric Power Research Institute, Fuzhou (CN); North China Electric Power University, Beijing (CN)

(*) Notice: Subject to any disclaimer, the term of this patent is extended or adjusted under 35 U.S.C. 154(b) by 130 days.

(21) Appl. No.: 17/121,730

(22) Filed: Dec. 14, 2020

(65) Prior Publication Data
US 2021/0102989 A1 Apr. 8, 2021

Related U.S. Application Data

(63) Continuation of application No. PCT/CN2020/107594, filed on Aug. 7, 2020.

(30) Foreign Application Priority Data

Aug. 7, 2019 (CN) .......................... 201910725102.2

(51) Int. Cl.
*G01R 31/12* (2020.01)
*G01R 1/067* (2006.01)

(52) U.S. Cl.
CPC ...... *G01R 31/1254* (2013.01); *G01R 1/06772* (2013.01)

(58) Field of Classification Search
CPC ..................... G01R 31/1254; G01R 1/06772
See application file for complete search history.

(56) References Cited

U.S. PATENT DOCUMENTS

| 4,617,513 A | * | 10/1986 | Reinhardt | H02B 13/055 |
| | | | | 361/306.1 |
| 9,329,221 B2 | * | 5/2016 | Fukasawa | G01R 31/58 |
| 2016/0245856 A1 | * | 8/2016 | Yanagi | G01R 31/1254 |

FOREIGN PATENT DOCUMENTS

CN 1127889 A 7/1996

* cited by examiner

*Primary Examiner* — Paresh Patel

(57) ABSTRACT

The present disclosure relates to a coaxial lead structure and method for radiating a GIS partial discharge UHF signal outward. The structure includes a GIS cavity, a circular hole provided on the GIS cavity, a medium cylinder provided at the circular hole and sealing the circular hole, a thin cylindrical metal lead that extends into and is fixed to the medium cylinder, and a ground lead connected to the thin cylindrical metal lead. According to the present disclosure, a relatively strong signal may be obtained outside a coaxial lead structure, and detection of a partial discharge UHF signal at this position may increase the detection sensitivity by one time compared with the detection methods of built-in and external disc insulators.

10 Claims, 6 Drawing Sheets

COAXIAL LEAD STRUCTURE AND METHOD FOR RADIATING GIS PARTIAL DISCHARGE UHF SIGNAL OUTWARD

CROSS REFERENCE TO RELATED APPLICATIONS

The present application is a Continuation Application of PCT Application No. PCT/CN2020/107594 filed on Aug. 7, 2020, which claims the benefit of Chinese Patent Application No. 201910725102.2 filed on Aug. 7, 2019. All the above are hereby incorporated by reference in their entirety.

FIELD

The present disclosure belongs to the field of high voltage technologies, and more particular, relates to a coaxial lead structure and method for radiating a GIS partial discharge UHF signal outward.

BACKGROUND

GIS (Gas Insulated Switchgear) is key equipment in a power system. A large area of power outage may occur once the GIS has an insulation failure. This may cause huge losses to the national economy and also cause social unrest. In order to avoid GIS insulation failures, it is necessary to detect and repair insulation defects in time. A partial discharge UHF (ultra-high-frequency) detection technology is an effective method. A UHF signal is an electromagnetic wave. At present, partial discharge detection is implemented by a built-in sensor, an external sensor, and the like. The built-in sensor has poor universality and is incapable of maintenance at outage. The external sensor is often affected by metal rings and has extremely low detection sensitivity. Therefore, finding an appropriate detection window is the key to GIS PD (partial discharge) detection.

SUMMARY

An objective of the present disclosure is to provide a coaxial lead structure and method for radiating a GIS partial discharge UHF signal outward, so as to improve detection sensitivity.

To achieve the foregoing objective, the present disclosure adopts the following technical solution: a coaxial lead structure for radiating a GIS partial discharge UHF signal outward, including a GIS cavity, a circular hole provided on the GIS cavity, a medium cylinder provided at the circular hole and sealing the circular hole, a thin cylindrical metal lead that extends into and is fixed to the medium cylinder, and a ground lead connected to the thin cylindrical metal lead.

In an embodiment of the present disclosure, one end of the ground lead is connected to a housing of the GIS cavity through a ground potential screw and is grounded, and the other end of the ground lead is fixedly connected to the thin cylindrical metal lead through two ground nuts screwed on the thin cylindrical metal lead.

In an embodiment of the present disclosure, the ground potential screw is fixed to the housing of the GIS cavity through a ground potential threaded hole provided in the housing of the GIS cavity.

In an embodiment of the present disclosure, the two ground nuts clamp and fix the other end of the ground lead to the thin cylindrical metal lead.

In an embodiment of the present disclosure, a radius of the thin cylindrical metal lead is denoted by a, a radius of the circular hole is denoted by b, a dielectric constant of the medium cylinder is denoted by $\varepsilon_r$, an upper cut-off frequency is no less than 2 GHz, and a, b, and $\varepsilon_r$ meet the following formula:

$$f_c = \frac{c}{\pi(a+b)\sqrt{\varepsilon_r}} \geq 2 \times 10^9$$

where c is a propagation velocity of an electromagnetic wave in vacuum, that is, $3 \times 10^8$ m/s, and $f_c$ is the upper cut-off frequency.

In an embodiment of the present disclosure, a length of the thin cylindrical metal lead is no more than one quarter of a wavelength of the upper cut-off frequency, the length of the thin cylindrical metal lead is denoted by l, and the following formula is met:

$$l \leq \frac{1}{4} \frac{c}{\sqrt{\varepsilon_r} f_c}$$

where c is the propagation velocity of the electromagnetic wave in vacuum, that is, $3 \times 10^8$ m/s, $f_c$ is the upper cut-off frequency, and $\varepsilon_r$ is the dielectric constant of the medium cylinder.

In an embodiment of the present disclosure, a part of the thin cylindrical metal lead extending into the medium cylinder is flush with an inner wall of the GIS cavity, but does not penetrate into the GIS cavity.

The present disclosure further provides a method for radiating the GIS partial discharge UHF signal outward based on the structure described above, including: providing a coaxial lead structure to radiate a UHF electromagnetic wave signal generated by the partial discharge inside the GIS cavity outside the circular hole; further enhancing, by using a current oscillation effect of the thin cylindrical metal lead, the UHF electromagnetic wave signal radiated outward; and providing a UHF detection sensor and an instrument next to the coaxial lead structure to detect UHF signals.

In an embodiment of the present disclosure, a radius of the thin cylindrical metal lead is denoted by a, a radius of the circular hole is denoted by b, a dielectric constant of the medium cylinder is denoted by $\varepsilon_r$, an upper cut-off frequency is no less than 2 GHz, and a, b, and $\varepsilon_r$ meet the following formula:

$$f_c = \frac{c}{\pi(a+b)\sqrt{\varepsilon_r}} \geq 2 \times 10^9$$

where c is the propagation velocity of the electromagnetic wave in vacuum, that is, $3 \times 10^8$ m/s, and $f_c$ is the upper cut-off frequency.

In an embodiment of the present disclosure, a length of the thin cylindrical metal lead is no more than one quarter of a wavelength of the upper cut-off frequency, the length of the thin cylindrical metal lead is denoted by l, and the following formula is met:

$$l \leq \frac{1}{4} \frac{c}{\sqrt{\varepsilon_r} f_c}$$

where c is the propagation velocity of the electromagnetic wave in vacuum, that is, 3×10⁸ m/s, $f_c$ is the upper cut-off frequency, and $\varepsilon_r$ is the dielectric constant of the medium cylinder.

Compared with the prior art, the present disclosure has the following beneficial effects: according to the present disclosure, a relatively strong signal may be obtained outside the coaxial lead structure, and detection of the partial discharge UHF signal at this position may increase the detection sensitivity by one time compared with the detection methods of built-in and external disc insulators.

DETAILED DESCRIPTION

The technical solutions of the present disclosure are particularly described below with reference to the accompanying drawings.

Figure 1:
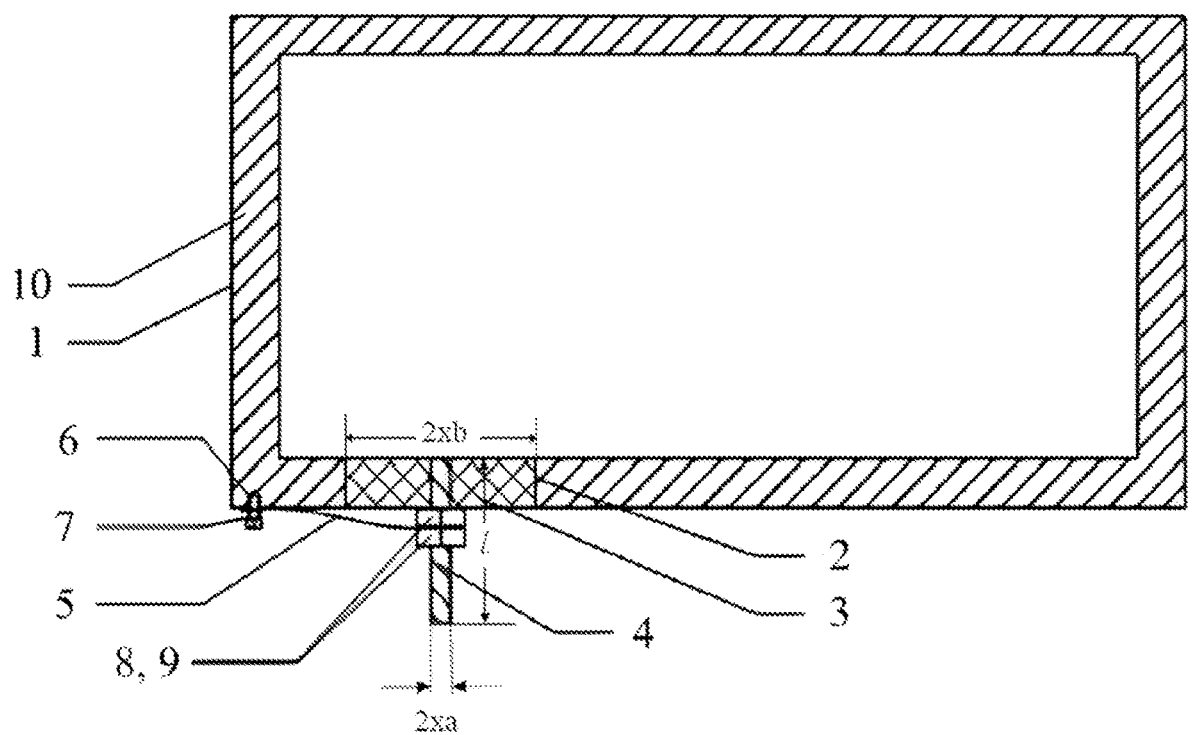
FIG. 1 illustrates a coaxial lead structure for radiating a GIS partial discharge UHF signal outward according to the present disclosure.

As shown in FIG. 1, the present disclosure provides a coaxial lead structure for radiating a GIS partial discharge UHF signal outward. The coaxial lead structure includes a GIS cavity 1, a circular hole 2 provided on the GIS cavity, a medium cylinder 3 provided at the circular hole and sealing the circular hole, a thin cylindrical metal lead 4 that extends into and is fixed to the medium cylinder, and a ground lead 5 connected to the thin cylindrical metal lead. One end of the ground lead connected to a housing 10 of the GIS cavity through a ground potential screw 7 and is grounded, and the other end of the ground lead is fixedly connected to the thin cylindrical metal lead through two ground nuts 8 and 9 screwed on the thin cylindrical metal lead. The ground potential screw is fixed to the housing 10 of the GIS cavity through a ground potential threaded hole 6 provided in the housing 10 of the GIS cavity. The two ground nuts clamp and fix the other end of the ground lead to the thin cylindrical metal lead. A part of the thin cylindrical metal lead extending into the medium cylinder is flush with an inner wall of the GIS cavity, but does not penetrate into the GIS cavity.

A radius of the thin cylindrical metal lead is denoted by a, a radius of the circular hole is denoted by b, a dielectric constant of the medium cylinder is denoted by $\varepsilon_r$, an upper cut-off frequency is no less than 2 GHz, and a, b, and $\varepsilon_r$ meet the following formula:

$$f_c = \frac{c}{\pi(a+b)\sqrt{\varepsilon_r}} \geq 2 \times 10^9$$

where c is a propagation velocity of an electromagnetic wave in vacuum, that is, 3×10⁸ m/s, and $f_c$ is the upper cut-off frequency.

A length of the thin cylindrical metal lead is no more than one quarter of a wavelength of the upper cut-off frequency, the length of the thin cylindrical metal lead is denoted by l, and the following formula is met:

$$l \leq \frac{1}{4} \frac{c}{\sqrt{\varepsilon_r} f_c}$$

where c is a propagation velocity of an electromagnetic wave in vacuum, that is, 3×10⁸ m/s, $f_c$ is the upper cut-off frequency, and $\varepsilon_r$ is a dielectric constant of the medium cylinder.

Figure 2:
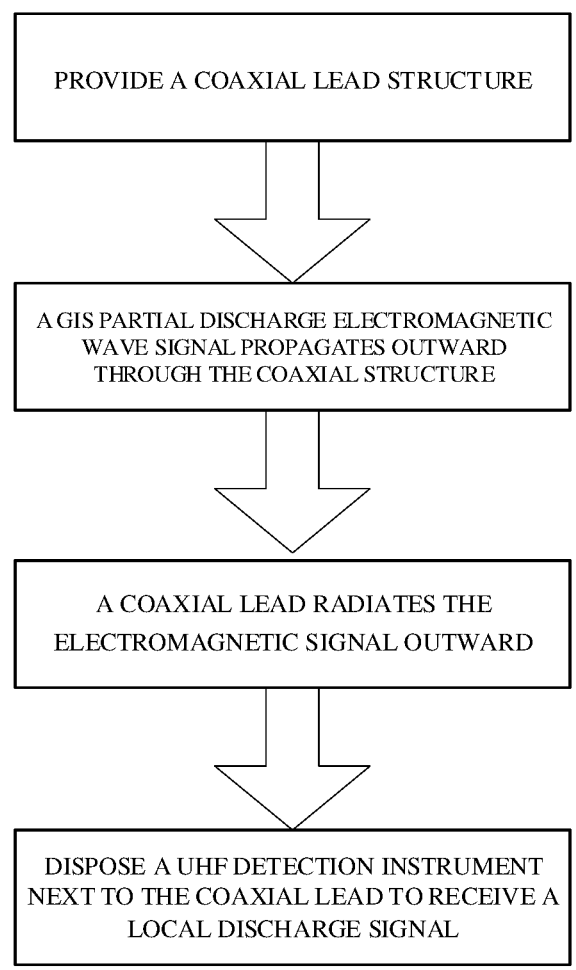
FIG. 2 is a schematic flowchart of a method for radiating a GIS partial discharge UHF signal outward according to the present disclosure.
Figure 3A:
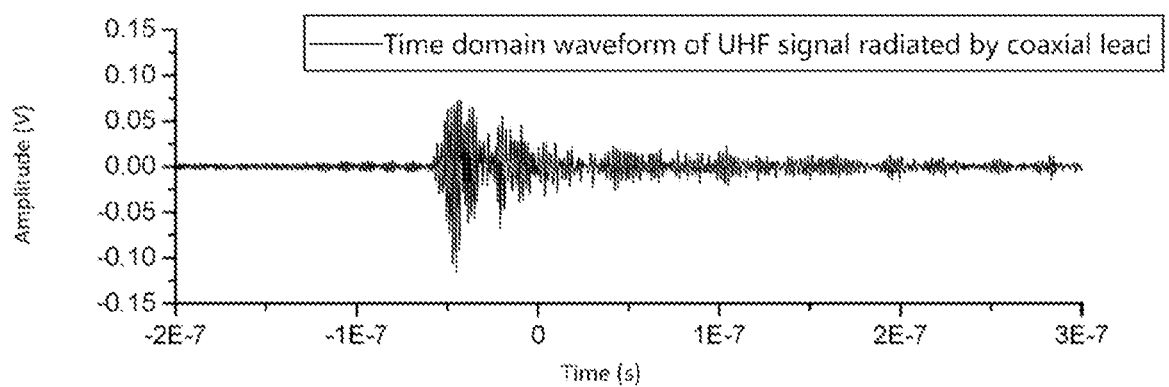
FIG. 3A is the time-domain waveform of the UHF signal radiated from the coaxial lead of the GIS of the present disclosure.
Figure 3B:
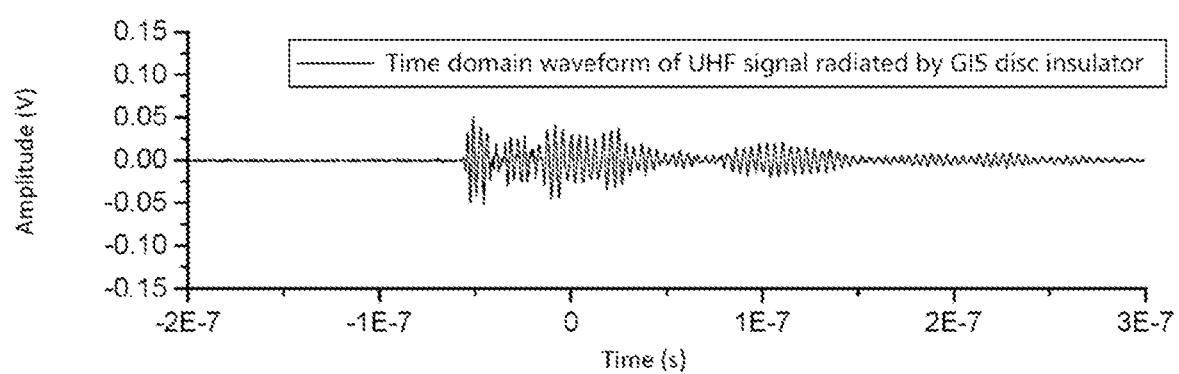
FIG. 3B is the time-domain waveform of the UHF signal radiated from the GIS disc insulator.
Figure 4A:
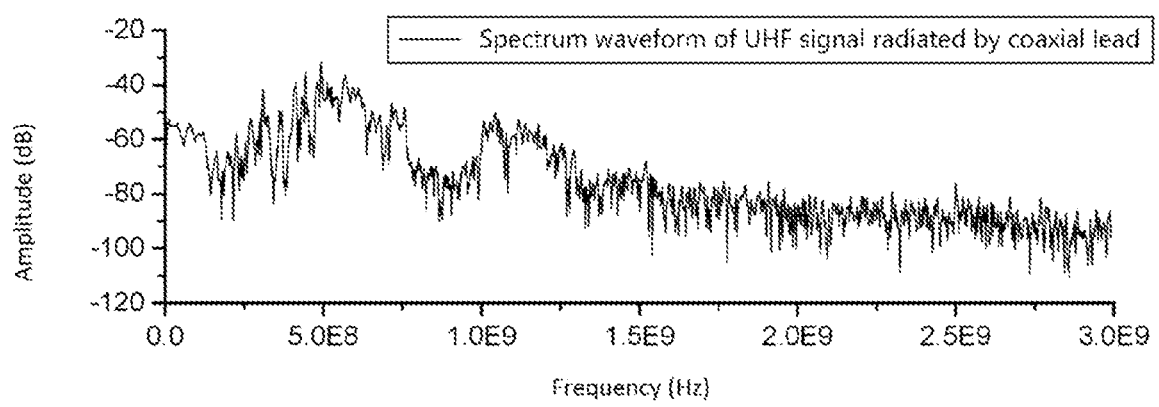
FIG. 4A is the spectrum waveform of the UHF signal radiated from the coaxial lead of the GIS of the present disclosure.
Figure 4B:
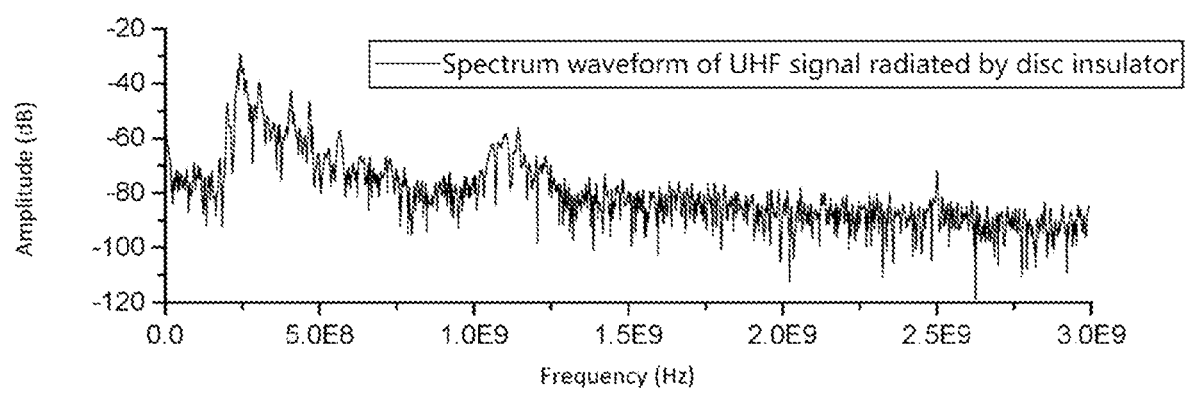
FIG. 4B is the spectrum waveform of the UHF signal radiated from the GIS disc insulator.

As shown in FIG. 2, the present disclosure further provides a method for radiating the GIS partial discharge UHF signal outward based on the structure described above, including: providing a coaxial lead structure to radiate a UHF electromagnetic wave signal generated by partial discharge inside the GIS cavity outside the circular hole; further enhancing, by using a current oscillation effect of the thin cylindrical metal lead, the UHF electromagnetic wave signal radiated outward; and providing a UHF detection sensor and an instrument next to the coaxial lead structure to detect UHF signals.

The following is a specific implementation process of the present disclosure.

A coaxial lead structure for radiating a GIS partial discharge UHF signal outward is provided on a housing of a GIS lightning arrester. Specifically, holes are provided on a base of the arrester to mount an epoxy resin cylinder, and coaxial leads are mounted inside the cylinder. A thickness of an inner wall of a GIS housing cavity is 20 mm, a radius of an inner surface is 3 mm, and a diameter of the cylindrical metal lead provided inside the epoxy resin cylinder is 5 mm. The metal lead is grounded. In this case, signal detection sensitivity at the outside is twice as high as that of the inside.

The UHF signals radiated by the GIS coaxial lead and the GIS disc insulator of the present disclosure are respectively detected, and time domain waveform and frequency spectrum waveform of the signals are drawn for effect comparison, as shown in FIGS. 3A, 3B, 4A and 4B. It can be seen by comparison that the UHF signal intensity radiated by the GIS coaxial lead is further enhanced than the UHF signal intensity radiated by the GIS disc insulator, which improves the detection sensitivity.

The above are preferred embodiments of the present disclosure. Any changes made according to the technical solutions of the present disclosure fall within the protection scope of the present disclosure when functions and effects produced by the changes do not exceed the scope of the technical solutions of the present disclosure.

The invention claimed is:

1. A coaxial lead structure for radiating a GIS partial discharge UHF signal outward, comprising a GIS cavity, a circular hole provided on the GIS cavity, a medium cylinder provided at the circular hole and sealing the circular hole, a thin cylindrical metal lead that extends into and is fixed to the medium cylinder, and a ground lead connected to the thin cylindrical metal lead, and the thin cylindrical metal lead is a coaxial lead.

2. The structure according to claim 1, wherein one end of the ground lead is connected to a housing of the GIS cavity through a ground potential screw and is grounded, and the other end of the ground lead is fixedly connected to the thin cylindrical metal lead through two ground nuts screwed on the thin cylindrical metal lead.

3. The structure according to claim 2, wherein the ground potential screw is fixed to the housing of the GIS cavity through a ground potential threaded hole provided in the housing of the GIS cavity.

4. The structure according to claim 2, wherein the two ground nuts clamp and fix the other end of the ground lead to the thin cylindrical metal lead.

5. The structure according to claim 1, wherein a radius of the thin cylindrical metal lead is denoted by a, a radius of the circular hole is denoted by b, a dielectric constant of the medium cylinder is denoted by $\varepsilon_r$, an upper cut-off frequency is no less than 2 GHz, and a, b, and $\varepsilon_r$ meet the following formula:

$$f_c = \frac{c}{\pi(a+b)\sqrt{\varepsilon_r}} \geq 2 \times 10^9$$

where c is a propagation velocity of an electromagnetic wave in vacuum, that is, $3 \times 10^8$ m/s, and $f_c$ is the upper cut-off frequency.

6. The structure according to claim 1, wherein a length of the thin cylindrical metal lead is no more than one quarter of a wavelength of the upper cut-off frequency, the length of the thin cylindrical metal lead is denoted by l, and the following formula is met:

$$l \leq \frac{1}{4}\frac{c}{\sqrt{\varepsilon_r}\, f_c}$$

where c is a propagation velocity of an electromagnetic wave in vacuum, that is, $3 \times 10^8$ m/s, $f_c$ is the upper cut-off frequency, and $\varepsilon_r$ is a dielectric constant of the medium cylinder.

7. The structure according to claim 1, wherein a part of the thin cylindrical metal lead extending into the medium cylinder is flush with an inner wall of the GIS cavity, but does not penetrate into the GIS cavity.

8. A method for radiating the GIS partial discharge UHF signal outward based on the structure according to claim 1, comprising: providing a coaxial lead structure to radiate a UHF electromagnetic wave signal generated by partial discharge inside the GIS cavity outside the circular hole; further enhancing, by using a current oscillation effect of the thin cylindrical metal lead, the UHF electromagnetic wave signal radiated outward; and providing a UHF detection sensor and an instrument next to the coaxial lead structure to detect UHF signals.

9. The method according to claim 8, wherein a radius of the thin cylindrical metal lead is denoted by a, a radius of the circular hole is denoted by b, a dielectric constant of the medium cylinder is denoted by $\varepsilon_r$, an upper cut-off frequency is no less than 2 GHz, and a, b, and $\varepsilon_r$ meet the following formula:

$$f_c = \frac{c}{\pi(a+b)\sqrt{\varepsilon_r}} \geq 2 \times 10^9$$

where c is a propagation velocity of an electromagnetic wave in vacuum, that is, $3 \times 10^8$ m/s, and $f_c$ is the upper cut-off frequency.

10. The method according to claim 8, wherein a length of the thin cylindrical metal lead is no more than one quarter of a wavelength of the upper cut-off frequency, the length of the thin cylindrical metal lead is denoted by l, and the following formula is met:

$$l \leq \frac{1}{4}\frac{c}{\sqrt{\varepsilon_r}\, f_c}$$

where c is a propagation velocity of an electromagnetic wave in vacuum, that is, $3 \times 10^8$ m/s, $f_c$ is the upper cut-off frequency, and $\varepsilon_r$ is a dielectric constant of the medium cylinder.

* * * * *